United States Patent
Fiscus

(10) Patent No.: US 6,731,147 B2
(45) Date of Patent: May 4, 2004

(54) METHOD AND ARCHITECTURE FOR SELF-CLOCKING DIGITAL DELAY LOCKED LOOP

(75) Inventor: Timothy E. Fiscus, South Burlington, VT (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/074,737

(22) Filed: Oct. 29, 2001

(65) Prior Publication Data

US 2003/0080791 A1 May 1, 2003

(51) Int. Cl.$^7$ ............................................. H03L 7/06
(52) U.S. Cl. ................................. 327/158; 327/156
(58) Field of Search ................................. 327/156, 158, 327/261, 263, 147, 149, 141

(56) References Cited

U.S. PATENT DOCUMENTS

| | | | |
|---|---|---|---|
| 5,844,954 A | 12/1998 | Casasanta et al. | 375/373 |
| 5,900,834 A * | 5/1999 | Kubinec | 342/115 |
| 5,923,597 A | 7/1999 | Tweed et al. | 365/194 |
| 5,994,934 A | 11/1999 | Yoshimura et al. | 327/158 |
| 6,064,232 A | 5/2000 | Relph | 326/93 |
| 6,065,126 A * | 5/2000 | Tran et al. | 713/401 |
| 6,069,506 A * | 5/2000 | Miller et al. | 327/156 |
| 6,087,868 A | 7/2000 | Millar | 327/156 |
| 6,100,733 A | 8/2000 | Dortu et al. | 327/149 |
| 6,125,158 A * | 9/2000 | Carson et al. | 327/156 |
| 6,144,713 A | 11/2000 | Eto | 375/375 |
| 6,222,894 B1 | 4/2001 | Lee | 375/376 |
| 6,242,955 B1 | 6/2001 | Shen et al. | 327/158 |
| 6,297,680 B1 * | 10/2001 | Kondo | 327/378 |
| 6,337,590 B1 * | 1/2002 | Millar | 327/158 |

* cited by examiner

Primary Examiner—Dinh T. Le
(74) Attorney, Agent, or Firm—Christopher P. Maiorana, P.C.

(57) ABSTRACT

An apparatus comprising a delay line and a control circuit. The delay line may be configured to generate an output signal in response to an input signal and one or more control signals. The delay line may be self-clocked. A phase of the output signal may be adjusted in response to the one or more control signals. The control circuit may be configured to generate the one or more control signals in response to the input signal and the output signal.

20 Claims, 14 Drawing Sheets

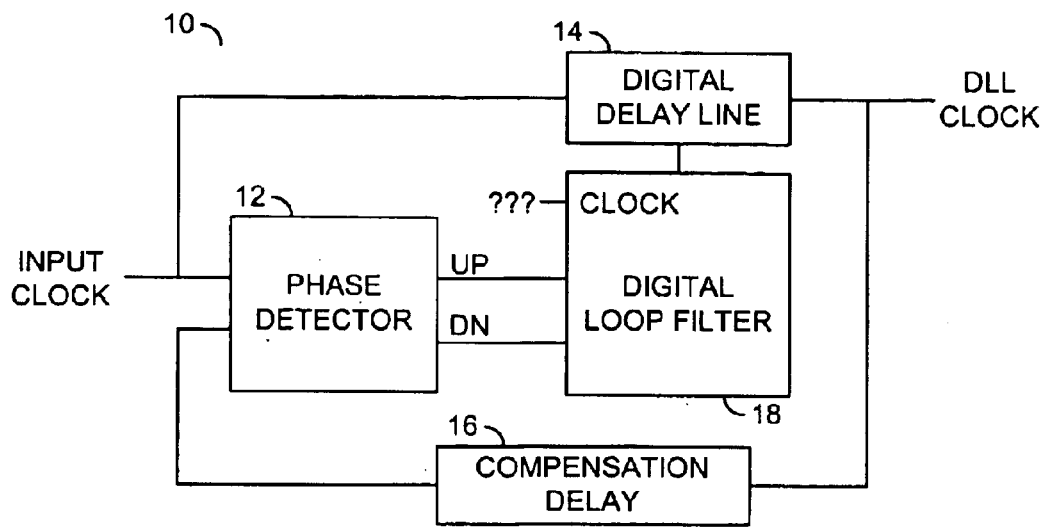
(CONVENTIONAL)
FIG. 1
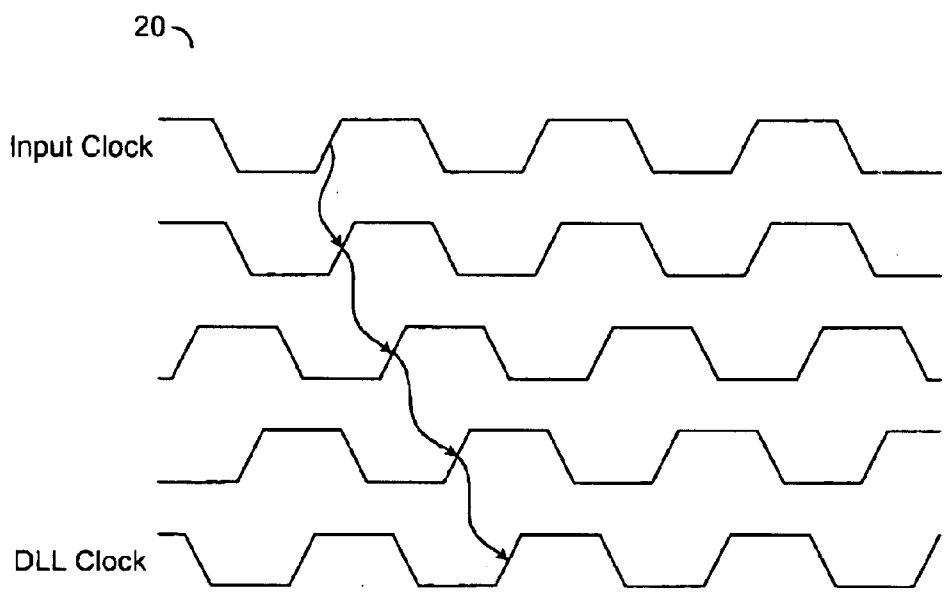
(CONVENTIONAL)
FIG. 2

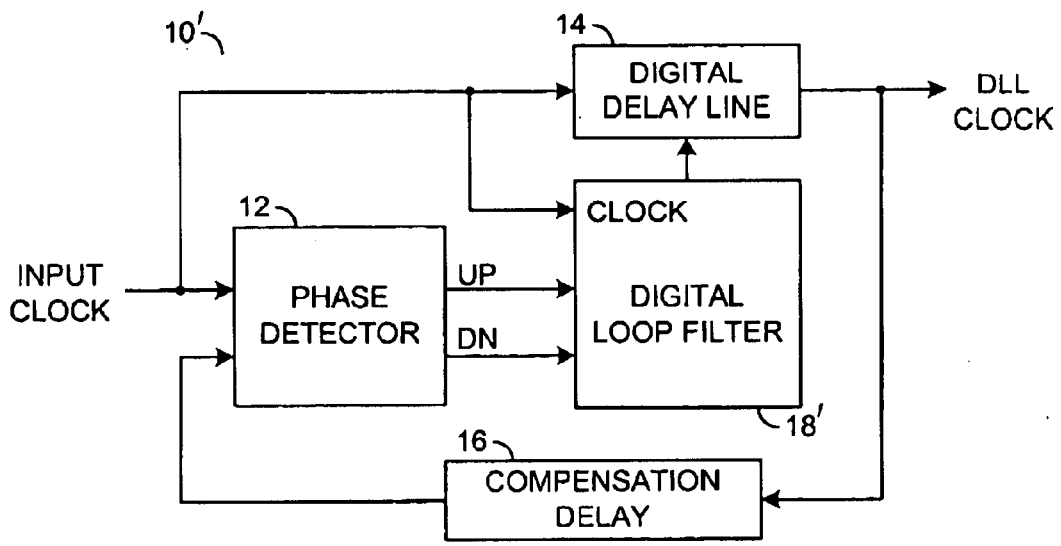
(CONVENTIONAL)
FIG. 3
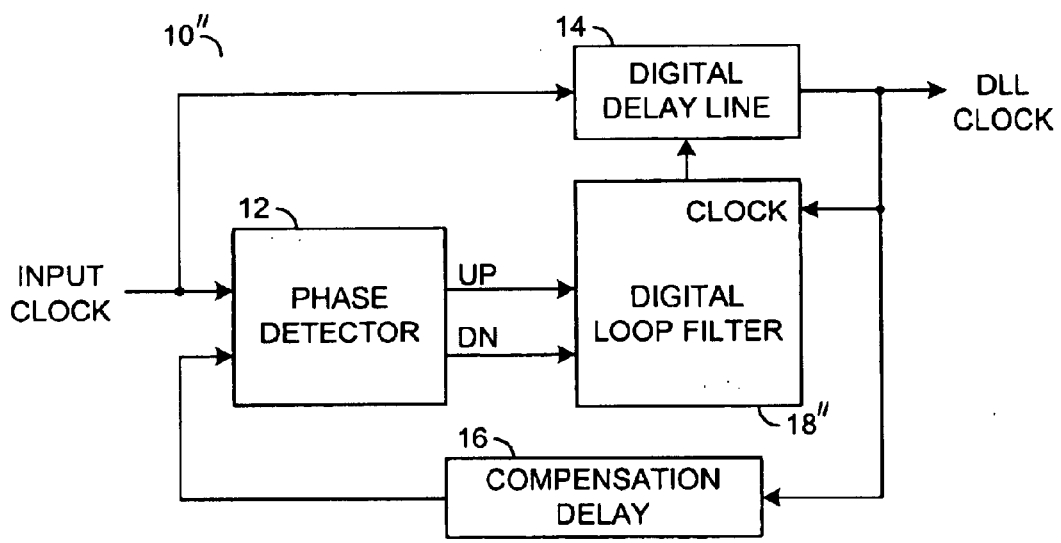
(CONVENTIONAL)
FIG. 4

METHOD AND ARCHITECTURE FOR SELF-CLOCKING DIGITAL DELAY LOCKED LOOP

FIELD OF THE INVENTION

The present invention relates to a method and/or architecture for Delay Locked Loops (DLLs) generally and, more particularly, to a method and architecture for a self-clocking a digital controlled Delay Locked Loop (DLL).

BACKGROUND OF THE INVENTION

Some applications can require that data be valid within a precise time from a clock edge. The clock to data valid (tco) time and the data output hold time (tdoh) dictate the data valid window. Also, the duty cycle of the data can be required to follow the duty cycle of the clock so that the data valid window is not reduced. A zero delay buffer that tracks the clock jitter and duty cycle can be used to meet the requirements.

A conventional zero delay buffer that tracks the clock jitter and duty cycle can include a Delay Locked Loop (DLL). The DLL can generate a phase-adjusted version of an input clock such that a desired edge (e.g., rising or falling) of the DLL clock occurs a time tco before a corresponding edge of the input clock. The phase-adjusted clock can be used to clock data out of a chip so that the data to input clock time is ideally zero.

The DLL is a closed loop system that adjusts the propagation through a delay line such that the delay is equal to the clock period minus the clock to output delay. A phase detector and filter adjust the delay line until a feedback clock is delayed 360 degrees (i.e., phase aligned) with respect to the input clock. Since the compensation delay can be set equal to the time tco, the delay line can have a delay equal to the clock period minus the time tco.

Referring to FIG. 1, a block diagram of a circuit 10 is shown illustrating a digital DLL. The circuit 10 includes a phase detector 12, a digital delay line 14, a compensation delay 16 and a digital loop filter 18. Every cycle the DLL 10 makes an adjustment with the phase detector 12 and filter 18 that corresponds to a phase adjustment in the delay line 14. One of the difficulties of designing a digital DLL is deciding how to clock the synchronous circuits. The digital loop filter 18 requires a clock to synchronously update the position of the delay line 14.

Referring to FIG. 2, a timing diagram 20 is shown illustrating various phases of the signal Input Clock propagating down the delay line 14 to generate the signal DLL_CLOCK. Because of the various clock phases in the delay line 14, guaranteeing that a clock edge will not be skipped or the duty cycle will not be corrupted is difficult. Two alternative approaches are used for clocking the digital filter 18 to update the delay line 14. The digital filter 18 can use the signal Input Clock (or a delayed version) or the signal DLL_CLOCK from an output of the delay line 14.

Referring to FIG. 3, a block diagrams of a circuit 10' is shown. The signal Input Clock can be used to clock the digital loop filter 18' to update the delay line 14. Whether the loop filter 18' is a counter, a shift register or a multiplexer tree, the signal Input Clock must update the delay line 14 such that none of the edges propagating down the delay line are changed. For long delay lines or low frequency there is more time to make the update. However, for high frequencies or short delay lines, multiple clock edges may be propagating down the delay line 14 and the timing is difficult to guarantee.

Referring to FIG. 4, a block diagram of a circuit 10" is shown. The circuit 10" is similar to the circuit 10 except that the loop filter 18" is clocked by the output clock DLL_CLOCK. The circuit 10" has the same difficulty as the circuit 10' at high frequencies since multiple clock edges can be propagating down the delay line 14. One approach for minimizing the timing constraint is to update only the end of the delay line 14. By updating only the end of the delay line 14, other edges earlier in the delay line will not be affected by the update and the critical time is the output clock edge until the next clock edge. However, the time from the output clock until the delay line is updated must be less than the duty cycle.

The disadvantage of the conventional approaches is that there is a timing constraint on the clocking of the digital loop filter 18 that can result in the DLL 10 missing edges or changing the duty cycle. The timing constraint reduces the maximum frequency of operation of the DLL 10.

It would be desirable to have a clocking scheme for a digital delay locked loop that minimizes the timing for updating the delay line.

SUMMARY OF THE INVENTION

The present invention concerns an apparatus comprising a delay line and a control circuit. The delay line may be configured to generate an output signal in response to an input signal and one or more control signals. The delay line may be self-clocked. A phase of the output signal may be adjusted in response to the one or more control signals. The control circuit may be configured to generate the one or more control signals in response to the input signal and the output signal.

The objects, features and advantages of the present invention include providing a digital delay locked loop that may (i) use a synchronous digital control to update the delay line position, (ii) have a delay line comprising multiple stages, (iii) have stages that propagate an output to a next stage and to a synchronous control circuit, (iv) have a self-clocking delay line, and/or (v) be used in applications that need a zero delay buffer including memory chips that need a small clock to output delay.

BRIEF DESCRIPTION OF THE DRAWINGS

These and other objects, features and advantages of the present invention will be apparent from the following detailed description and the appended claims and drawings in which:

FIG. 1 is a block diagram of a digital delay lock loop circuit;

FIG. 2 is a timing diagram illustrating multiple phases of an input signal of FIG. 1;

FIG. 3 is a block diagram of a conventional digital delay lock loop clocking scheme;

FIG. 4 is a block diagram of another conventional digital delay lock loop clocking scheme;

DETAILED DESCRIPTION OF THE PREFERRED EMBODIMENTS

The present invention generally provides a self-clocking scheme for updating a delay line of a digital delay locked loop (DLL). The delay line may comprise a plurality of delay stages. Each delay stage of the delay line generally propagates an output clock to a next stage and also updates an associated local pointer. The delay line architecture of the present invention may comprise a shift register configured to choose which delay cell (stage) drives the output of the delay locked loop. The present invention may use local clocks to avoid driving the output of the delay line through the loop filter and then updating the pointers. Instead, a local update of the pointers may be performed.

Figure 5:
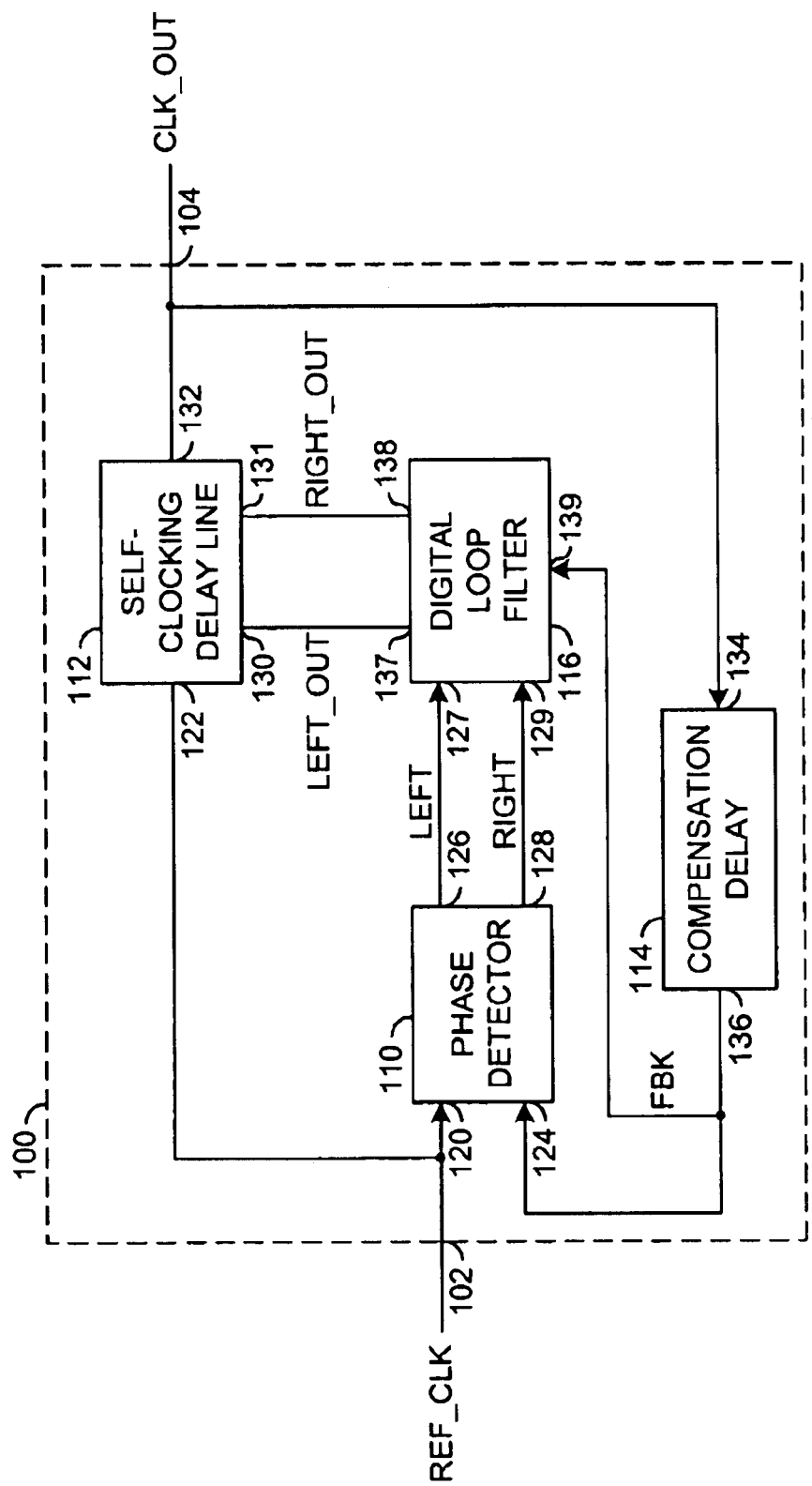
FIG. 5 is a block diagram of a preferred embodiment of the present invention.

Referring to FIG. 5, a block diagram of a circuit 100 is shown in accordance with a preferred embodiment of the present invention. The circuit 100 may be implemented as a digital delay locked loop (DLL) with a self-clocking delay line. The circuit 100 may have an input 102 that may receive a reference clock (e.g., REF_CLK) and an output 104 that may present a signal (e.g., CLK_OUT). The circuit 100 may be configured to generate the signal CLK_OUT having an edge (e.g., rising or falling) that precedes a corresponding edge of the signal REF_CLK by a predetermined period of time (e.g., tco). The signal CLK_OUT may track the jitter and duty cycle of the signal REF_CLK.

The circuit 100 may comprise a circuit 110, a circuit 112, a circuit 114, and a circuit 116. The circuit 110 may be implemented as a phase detector circuit. The circuit 112 may be implemented as a self-clocking delay line. The circuit 112 may be configured to provide a delay that may be adjusted. The circuit 114 may be implemented as a compensation delay circuit. In one example, the circuit 114 may be implemented to compensate for a clock to output delay time (tco) of a memory circuit. The circuit 116 may be implemented as a digital loop filter. In one example, the circuit 116 may be implemented with digital logic.

The signal REF_CLK may be presented to an input 120 of the circuit 110 and an input 122 of the circuit 112. The circuit 110 may have an input 124 that may receive a signal (e.g., FBK), an output 126 that may present a signal (e.g., LEFT) that may be presented to an input 127 of the circuit 116, and an output 128 that may present a signal (e.g., RIGHT) that may be presented to an input 129 of the circuit 116. The signal FBK may be a feedback signal generated in response to the signal CLK_OUT. The signals LEFT and RIGHT may be control signals. In one example, the signals LEFT and RIGHT may be configured to control phase adjustments in the signal CLK_OUT. The circuit 110 may be configured to generate the signals LEFT and RIGHT in response to the signals REF_CLK and FBK.

The circuit 112 may have an input 130 that may receive a signal (e.g., LEFT_OUT), an input 131 that may receive a signal (e.g., RIGHT_OUT) and an output 132 that may present the signal CLK_OUT. The circuit 112 may be configured to adjust an amount of delay in response to the signals LEFT_OUT and RIGHT_OUT. The circuit 112 may be configured to generate the signal CLK_OUT as a phase-adjusted version of the signal REF_CLK, where the phase adjustment is determined in response to the signals LEFT_OUT and RIGHT_OUT.

The circuit 114 may have an input 134 that may receive the signal CLK_OUT and an output 136 that may present the signal FBK. The circuit 114 may be configured to generate the signal FBK in response to the signal CLK_OUT. In one example, the circuit 114 may be configured to compensate for a clock to output delay (tco) of a memory device. However, other delays may be compensated accordingly to meet the design criteria of a particular application.

The circuit 116 may have an output 137 that may present the signal LEFT_OUT, an output 138 that may present the signal RIGHT_OUT and an input 139 that may receive the signal FBK. The signals LEFT_OUT and RIGHT_OUT may be implemented as control signals. The circuit 116 may be configured to generate the signals LEFT_OUT and RIGHT_OUT in response to the signals LEFT, RIGHT and FBK.

Figure 6:
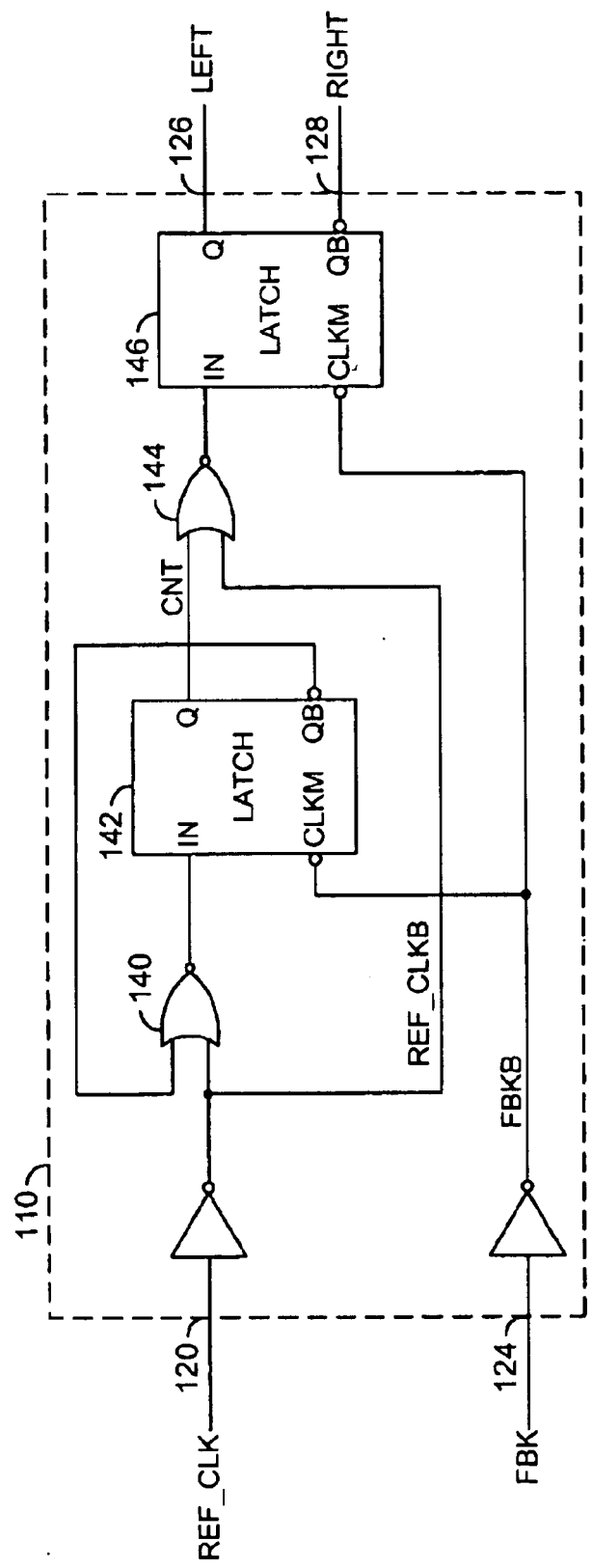
FIG. 6 is a more detailed block diagram of a phase detector of FIG. 5.

Referring to FIG. 6, a more detailed block diagram of the circuit 110 of FIG. 4 is shown. The circuit 110 may comprise a gate 140, a storage element 142, a gate 144, and a storage element 146. The gates 140 and 144 may be implemented, in one example, as two-input NOR gates. However, other gate types may be implemented accordingly to meet the design criteria of a particular application. The storage elements 142 and 146 may be implemented, in one example, as latches. However, other storage elements may be implemented accordingly to meet the design criteria of a particular application. For example, the storage elements 142 and 146 may be implemented as registers, flip-flops, etc.

A complement of the signal REF_CLK (e.g., REF_CLKB) may be presented to a first input of the gates 140 and 144. An output of the gate 140 may be presented to an input of the storage element 142. A complement of the signal FBK (e.g., FBKB) may be presented to a clock input of the storage elements 142 and 146. The storage element 142 may have an output (e.g., QB) that may be connected to a second input of the gate 140 and an output (e.g., Q) that may present a signal (e.g., CNT) to a second input of a gate 144. An output of the gate 144 may present a signal to an input of the storage element 146. The storage element 146 may be configured to present the signal RIGHT at a QB-output and the signal LEFT at a Q-output.

The storage elements 142 and 146 may be configured to start up (initialize) with a predetermined value. For example, the storage element 142 may have an initialized value of 1 and the storage element 146 may have an initialized value of 0. Following startup, the signal RIGHT may be presented at a logical HIGH state and the signal LEFT may be presented at a logical LOW state. The signal RIGHT will generally remain in a logical HIGH state until the signal FBK latches the signal REF_CLKB with a logic HIGH state. While the signal RIGHT remains HIGH, the delay line 112 may be configured to increase the delay of the signal FBK by repeatedly adding a predetermined amount of delay (e.g., one delay cell at a time) until the rising edge of the signal FBK occurs after a rising edge of the signal REF_CLK (a falling edge of the signal REF_CLKB).

Figure 7:
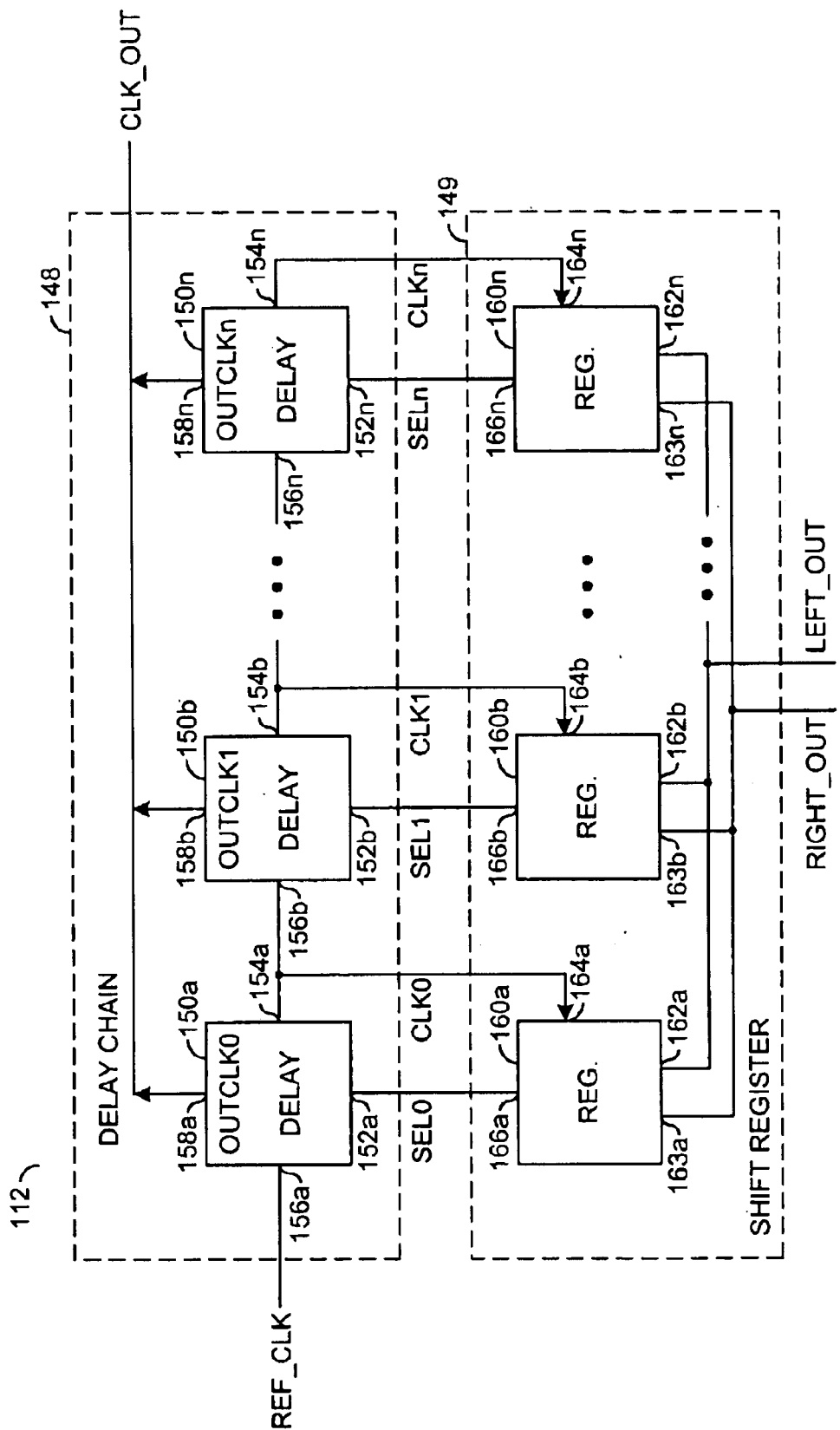
FIG. 7 is a top level diagram of a self-clocking delay line of FIG. 5.

Referring to FIG. 7, a top level diagram of the circuit 112 of FIG. 5 is shown. The circuit 112 may comprise a circuit 148 and a circuit 149. The circuit 148 may be implemented as a delay chain. The circuit 149 may be implemented as a shift register. The circuit 148 may receive (i) the signal REF_CLK and (ii) a number of control signals (e.g., SEL0–SELn) from the circuit 149. The circuit 148 may be configured to generate a plurality of clock signals (e.g., CLK0–CLKn) and the signal CLK_OUT in response to the signal REF_CLK and the signals SEL0–SELn. The circuit 149 may receive the signals LEFT_OUT and RIGHT_OUT from the circuit 116 and the plurality of clock signals CLK0–CLKn from the circuit 148. The circuit 149 may be configured to generate the signals SEL0–SELn in response to the signals LEFT_OUT and RIGHT_OUT and the plurality of clock signals CLK0–CLKn.

During a delay adjustment of a lock sequence, the signal RIGHT_OUT may be set to a first state and the delay line 112 may be configured to add a predetermined amount of delay. When the signal RIGHT_OUT is de-asserted and the signal LEFT_OUT is set to a first state (e.g., asserted), the delay line 112 may be configured to remove a predetermined amount of delay. The shift register 149 may be configured to increment through a number of delay increments during the adjustment. Each cycle a shift right may occur and the output of the delay chain 148 may be taken from the next delay element 150. All delay elements that have a logical LOW or "zero" on an enable input may be powered down so that only the minimum number of active delay elements necessary are used. Minimizing the number of delay elements may reduce power consumption.

The circuit 148 may comprise a number of delay elements 150a–150n. The delay elements 150a–150n may have an input 152a–152n that may receive a respective one of the signals SEL0–SELn, an output 154a–154n that may present a respective one of the signals CLK0–CLKn, an input 156a–156n that may receive either (i) the reference clock REF_CLK or (ii) one of the signals CLK0–CLKn from a prior delay element, and an output 158a–158n that may present the signal CLK_OUT. The outputs 158a–158n may be connected to form a node 159 at which the signal CLK_OUT may be presented. The circuits 150a–150n may be configured to generate the signals CLK0–CLKn and CLK_OUT in response to the signals REF_CLK and SEL0–SELn. The circuits 150a–150n may be further configured to generate the signals CLK0–CLKn even when the outputs 158a–158n are disabled.

The circuit 149 may comprise a number of register elements (circuits) 160a–160n. The circuits 160a–160n may have an input 162a–162n that may receive, in one example, the signal LEFT_OUT, an input 163a–163n that may receive the signal RIGHT_OUT, an input 164a–164n that may receive a respective one of the signals CLK0–CLKn, and an output 166a–166n the may present a respective one of the signals SEL0–SELn. The circuits 160a–160n may be configured to generate the signals SEL0–SELn in response to the signals LEFT_OUT, RIGHT_OUT and CLK0–CLKn.

Figure 8:
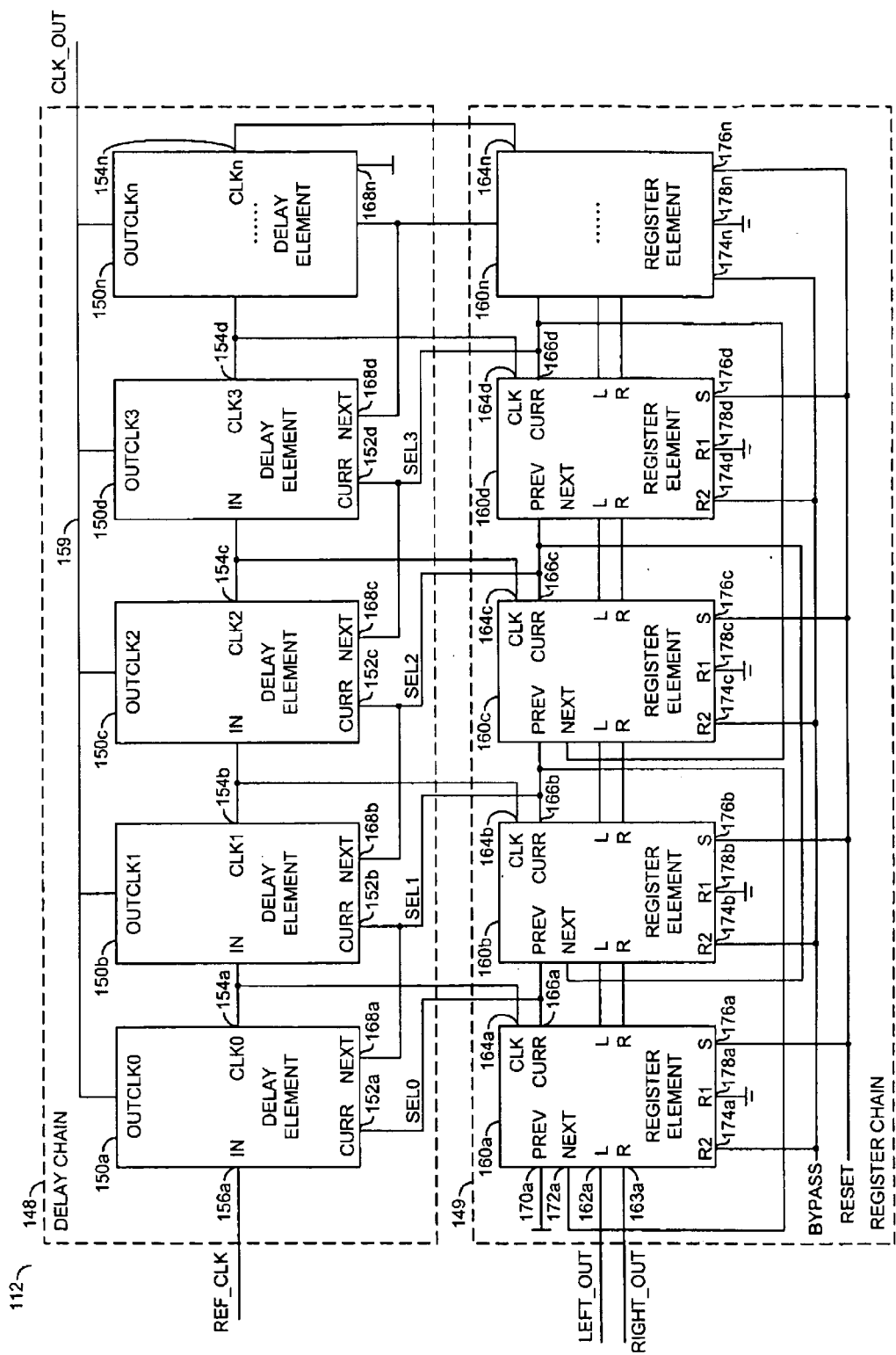
FIG. 8 is a more detailed block diagram of a self-clocking delay line of FIG. 7.

Referring to FIG. 8, a more detailed block diagram of the circuit 112 of FIG. 5 is shown. The circuits 150a–150(n–1) may have an input 168a–168(n–1) that may receive a respective one of the signals SEL1–SELn from a next delay element in the delay chain 148. For a delay element 150i, a signal SELi may be referred to as a current select signal (e.g., CURR) and a signal SEL(i+1) may be referred to as a next select signal (e.g., NEXT). The input 168n of a last delay element 150n in the delay chain 148 may be connected to a supply voltage (e.g., VCC) or a voltage supply ground (e.g., VSS).

The circuits 160a–160n may have inputs 170a–170n that may receive either a supply voltage (e.g., VCC or VSS) or a respective one of the signals SEL0–SELn from a previous register element 160 in the register chain 149. The circuits 160a–160n may have an input 172a–172n that may receive either the supply voltage VCC, the supply voltage ground potential VSS, or a respective one of the signals SEL0–SELn from a next register element 160 in the register chain 149. For example, a register element 160i may receive the signal SEL(i–1) at the input 170i and the signal SEL(i+1) at the input 172i. The input 170a of the register element 160a may receive the supply voltage VCC.

The delay line 112 may be configured to receive a control signal (e.g., BYPASS) that may be used to pass the signal REF_CLK directly to the output 132. The delay line 112 may be configured to receive a control signal (e.g., RESET) that may be used to set the delay line 112 to a predetermined amount of delay. The circuits 160a–160n may have an input 174a–174n that may receive the signal BYPASS and an input 176a–176n that may receive the signal RESET.

Figure 9:
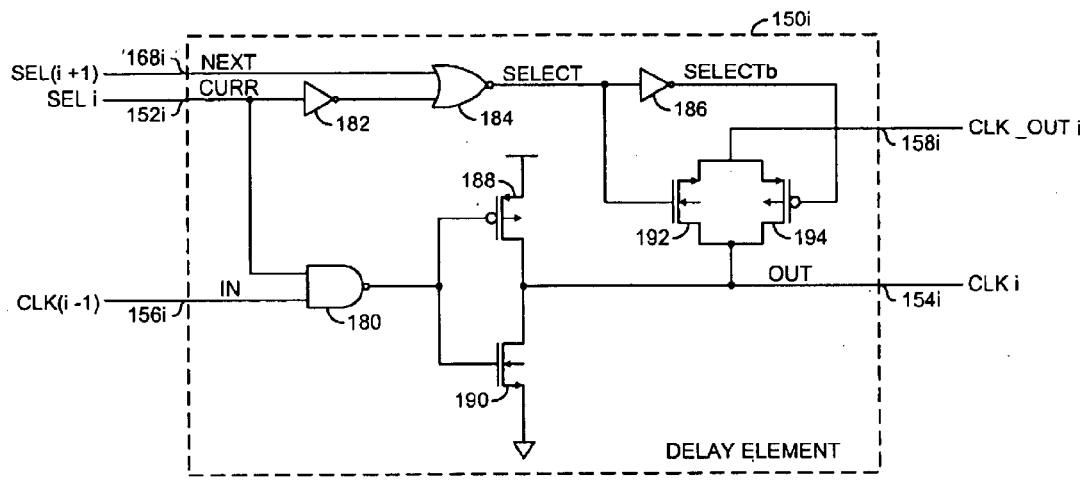
FIG. 9 is a detailed block diagram of a delay element of FIG. 6.

Referring to FIG. 9, a more detailed block diagram of an example delay element 150i is shown. The circuit 150i may comprise a gate 180, a gate 182, a gate 184, a gate 186 and a number of MOS transistors 188–194. The gate 180 may be implemented as a 2-input NAND gate. The gates 182 and 186 may be implemented as inverters. The gate 184 may be implemented as a 2-input NOR gate. However, other types of gates may be implemented to meet the design criteria of a particular application. A clock signal CLK(i–1) may be presented to a first input of the gate 180. The signal SELi may be presented to a second input of the gate 180 and an input of the gate 182. A signal SEL(i+1) may be presented to a first input of the gate 184. An output of the gate 182 may be presented to a second input of the gate 184. The gate 184 may be configured to generate a signal (e.g., SELECT) in response to the signal SEL(i+1) and the digital complement of the signal SELi. An output of the gate 184 may be connected to an input of the gate 186. A digital complement of the signal SELECT (e.g., SELECTb) may be presented at an output of the gate 186.

The transistors 188 and 194 may be implemented as one or more PMOS transistors. The transistors 190 and 192 may be implemented as one or more NMOS transistors. However, other types and/or polarity transistors may be implemented accordingly to meet the design criteria of a particular application. The transistors 188 and 190 may be configured, in one example, as a CMOS inverter. The transistors 192 and 194 may be configured, in one example, as a CMOS pass gate. An output of the gate 180 may be presented to a gate of the transistor 188 and a gate of the transistor 190. A source of the transistor 188 may be connected to the supply VCC. A drain of the transistor 188 may be connected to a drain of the transistor 190, a drain of the transistor 192 and a drain of the transistor 194. A source of the transistor 190 may be connected to a voltage supply ground VSS. An output of the CMOS pass gate formed by the transistors 192 and 194 may present the signal CLK_OUTi. The signal CLKi may be presented at the node formed by the connection of the drains of the transistors 188–194. The output of the gate 184 may be connected to a gate of the transistor 192. An output of the gate 186 may be connected to a gate of the transistor 194.

Figure 10:
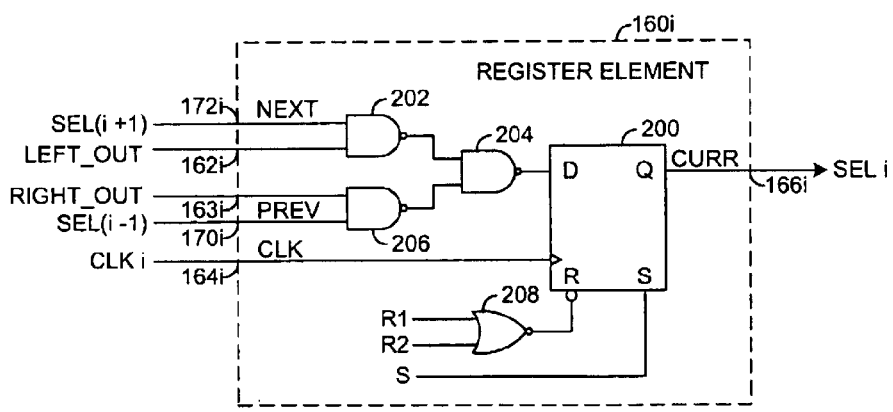
FIG. 10 is a detailed block diagram of a register element of FIG. 6.

Referring to FIG. 10, a more detailed block diagram of an example register element 160$i$ of FIG. 8 is shown. Each delay element 150$i$ generally has a corresponding register element 160$i$. Each register element 160$i$ may receive a signal from a previous stage register element (e.g., PREV), a signal from a next stage register element (e.g., NEXT), the signal LEFT_OUT, the signal RIGHT_OUT, and a number of control signals (e.g., R1, R2, S, etc.).

The circuit 160$i$ may comprise a storage element 200, a gate 202, a gate 204, a gate 206, and a gate 208. The storage element 200 may be implemented, for example, as a flip-flop, register or latch circuit. In one example, the storage element 200 may be implemented as a D-type flip-flop with a set input and a reset input. The gates 202–206 may be implemented as two-input NAND gates. The gate 208 may be implemented as a two-input NOR gate. However, other types of gates and other numbers of inputs may be implemented accordingly to meet the design criteria of a particular application.

The clock signal CLKi may be presented to a clock input of the storage element 200. A signal from a next register element (e.g., SEL(i+1)) may be presented to a first input of the gate 202. The signal LEFT_OUT may be presented to a second input of the gate 202. An output of the gate 202 may be connected to a first input of the gate 204. An output of the gate 204 may be connected to an input (e.g., the D-input) of the storage element 200. A signal from a previous register element (e.g., SEL(i−1)) may be presented to a first input of the gate 206. The signal RIGHT_OUT may be presented to a second input of the gate 206. An output of the gate 206 may be connected to a second input of the gate 204. A control signal (e.g., R1) may be present to a first input of the gate 208. A control signal (e.g., R2) may be present to a second input of the gate 208. An output of the gate 208 may be connected to the reset input of the storage element 200. A control signal (e.g., S) may be presented to the set input of the storage element 200. The signal SELi may be presented at a Q-output of the storage element 200. In one example, the signal BYPASS may be used as the signal R1, the signal RESET may be used as the signal S, and the supply ground VSS may be used as the signal R2.

Figure 11:
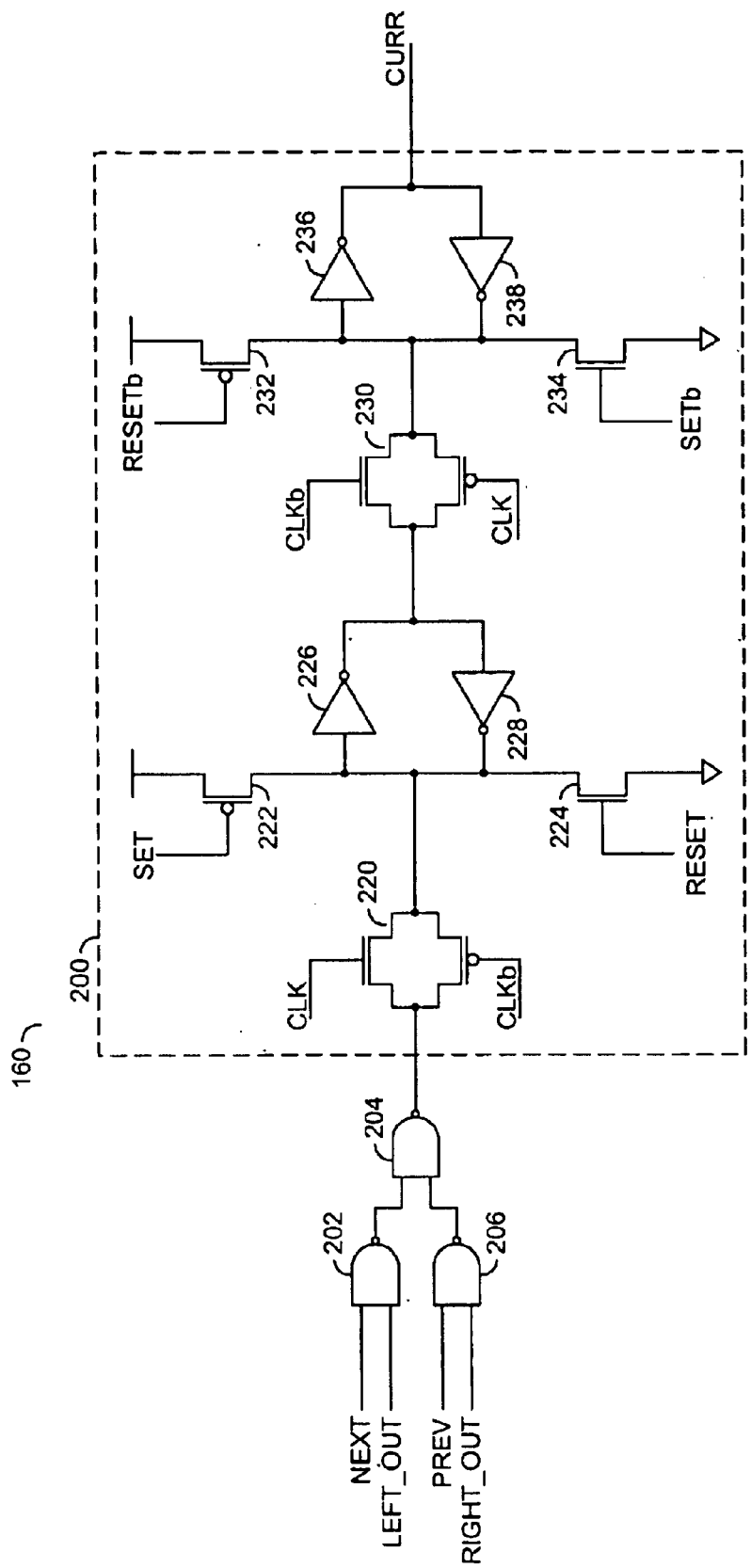
FIG. 11 is a more detailed block diagram of a register element of FIG. 6.

Referring to FIG. 11, a more detailed block diagram of the circuit 160 of FIG. 10 is shown. The storage element 200 may be implemented, in one example, as one or more latches. In one example, the storage element 200 may be implemented as two latches. A first latch may comprise a CMOS pass gate 220, a transistor 222, a transistor 224, an inverter 226, an inverter 228. A second latch may comprise a CMOS pass gate 230, a transistor 232, a transistor 234, an inverter 236 and an inverter 238. The first latch may be configured to store a signal from the gate 204 in response to a first state of a signal (e.g., CLK). The second latch may be configured to store an output of the first latch in response to a second state of the signal CLK. The contents of the first and second latches may be set or reset in response to a set signal (e.g., SET) or a reset signal (e.g., RESET), respectively.

Figure 12:
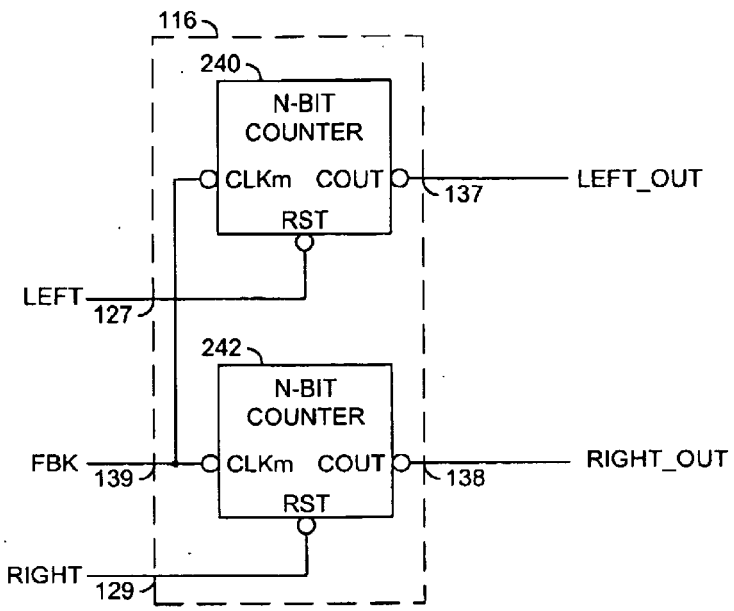
FIG. 12 is a more detailed block diagram of a digital loop filter of FIG. 5.

Referring to FIG. 12, a more detailed block diagram of a digital loop filter 116 of FIG. 5 is shown. The circuit 116 may comprise, in one example, a counter 240 and a counter 242. The counters 240 and 242 may be implemented as n-bit counters, where n is an integer. The signal LEFT may be presented to a reset input of the counter 240. The signal RIGHT may be presented to a reset input of the counter 242. The signal LEFT_OUT may be presented at an output of the counter 240. The signal RIGHT_OUT may be presented at an output of the counter 242. The signal FBK may be presented to a clock input of the counters 240 and 242. When the circuit 110 asserts the signals LEFT and/or RIGHT, the counters 240 and 242, respectively, may be enabled. Each time the signal FBK is asserted, the enabled counter(s) may increment (or decrement) until a maximum (minimum) count is reached. When the counters 240 and 242 reach the maximum (minimum) count, the respective output signal (e.g., LEFT_OUT or RIGHT_OUT) may be asserted. When a maximum count is used to generate the signals LEFT_OUT and RIGHT_OUT, the outputs of the counters 240 and 242 may be implemented as carry outputs. When a minimum count is used to generate the signals LEFT_OUT and RIGHT_OUT, the outputs of the counters 240 and 242 may be implemented as borrow outputs.

Figure 13:
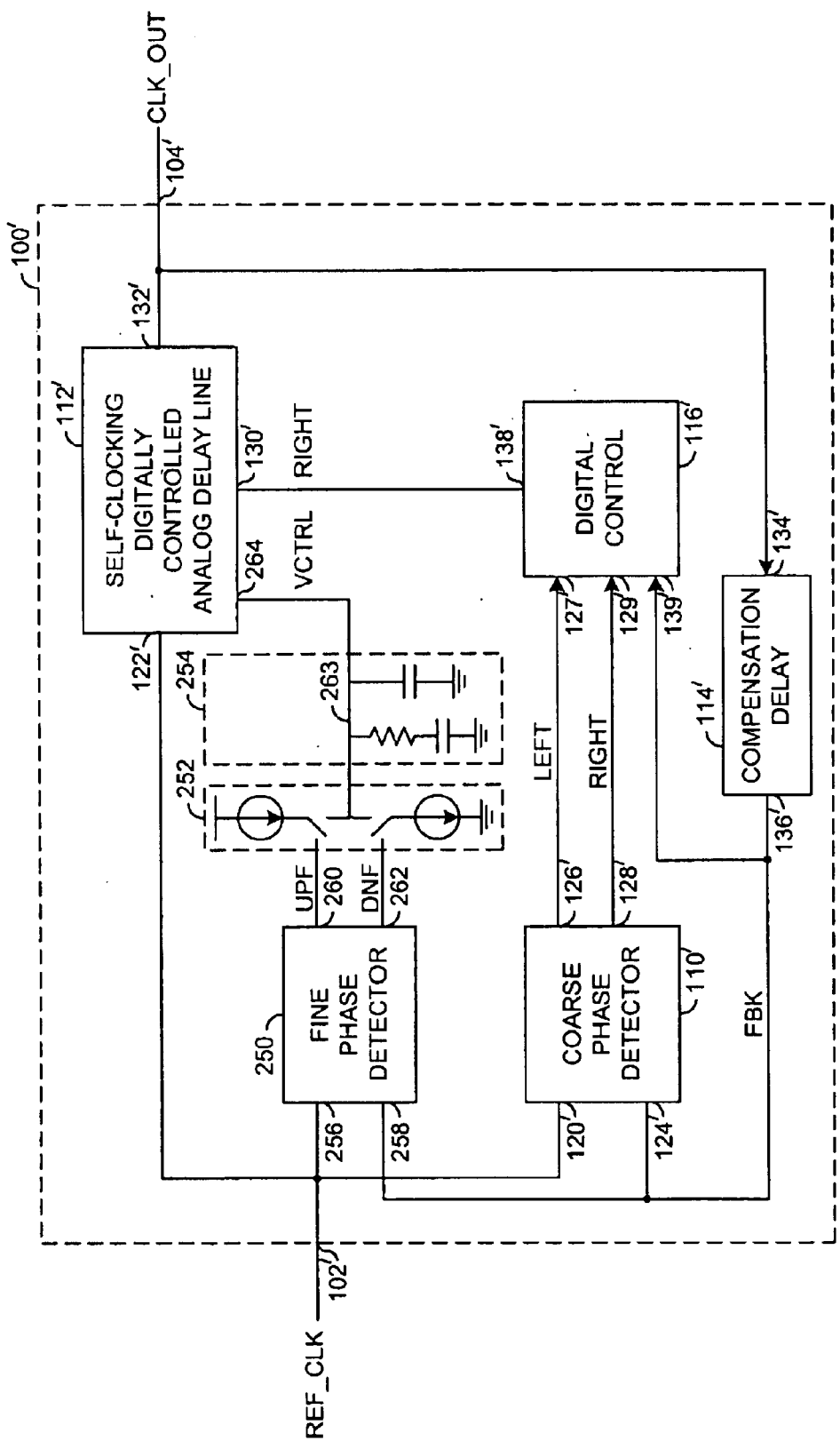
FIG. 13 is a block diagram of another preferred embodiment of the present invention.

Referring to FIG. 13, a block diagram of a circuit 100' is shown illustrating another preferred embodiment of the present invention. The circuit 100' may be implemented similarly to a digital controlled analog delay locked loop as described in co-pending application U.S. Ser. No. 09/918,583 (which is hereby incorporated by reference in its entirety) except that the delay line 112' may be implemented as a self-clocking digitally controlled analog delay line in accordance with the present invention. The circuit 100' may be similar to the circuit 100 except that the circuit 100' may further comprise a circuit 250, a circuit 252 and a circuit 254. The circuit 250 may be implemented as a fine (resolution) phase detector circuit. The circuits 250, 252 and 254 may be implemented similarly to a fine (resolution) phase detector circuit and associated charge pump circuit and analog loop filter as described in co-pending application U.S. Ser. No. 09/918,583.

The circuit 250 may have an input 256 that may receive the signal REF_CLK, an input 258 that may receive the signal FBK, an output 260 that may present a control signal (e.g., UPF) that may be presented to a first input of the circuit 252, and an output 262 that may present a second control signal (e.g., DNF) that may be presented to a second input of the circuit 252. The signals UPF and DNF may be charge pump control signals (e.g., pump-up and pump-down, respectively). In one example, the signals UPF and DNF may be used to make fine phase adjustments in the signal CLK_OUT.

The circuit 252 may have an output that may present a signal to an input of the circuit 254. The circuit 252 may be configured to generate, in one example, a current signal in response to the signals UPF and DNF. The circuit 252 may comprise a number of current sources that may be controlled using the signals UPF and DNF.

The circuit 254 may comprise a number of filter elements. In one example, the circuit 254 may comprise a resistor, a first capacitor, and a second capacitor. A node 263 may be formed by connecting the input and output of the circuit 154 to a first terminal of the resistor and a first terminal of the first capacitor. A second terminal of the resistor may be connected to a first terminal of the second capacitor. A second terminal of the first capacitor and the second capacitor may be connected to a supply ground. A signal (e.g., VCTRL) may be presented at the node 263. The signal VCTRL may be generated in response to the signals UPF and DNF. The circuit 112' may be further configured to generate a delay that may be finely and continuously varied within a particular range in response to the signal VCTRL. The particular range may be selected in response to the signal RIGHT.

Figure 14:
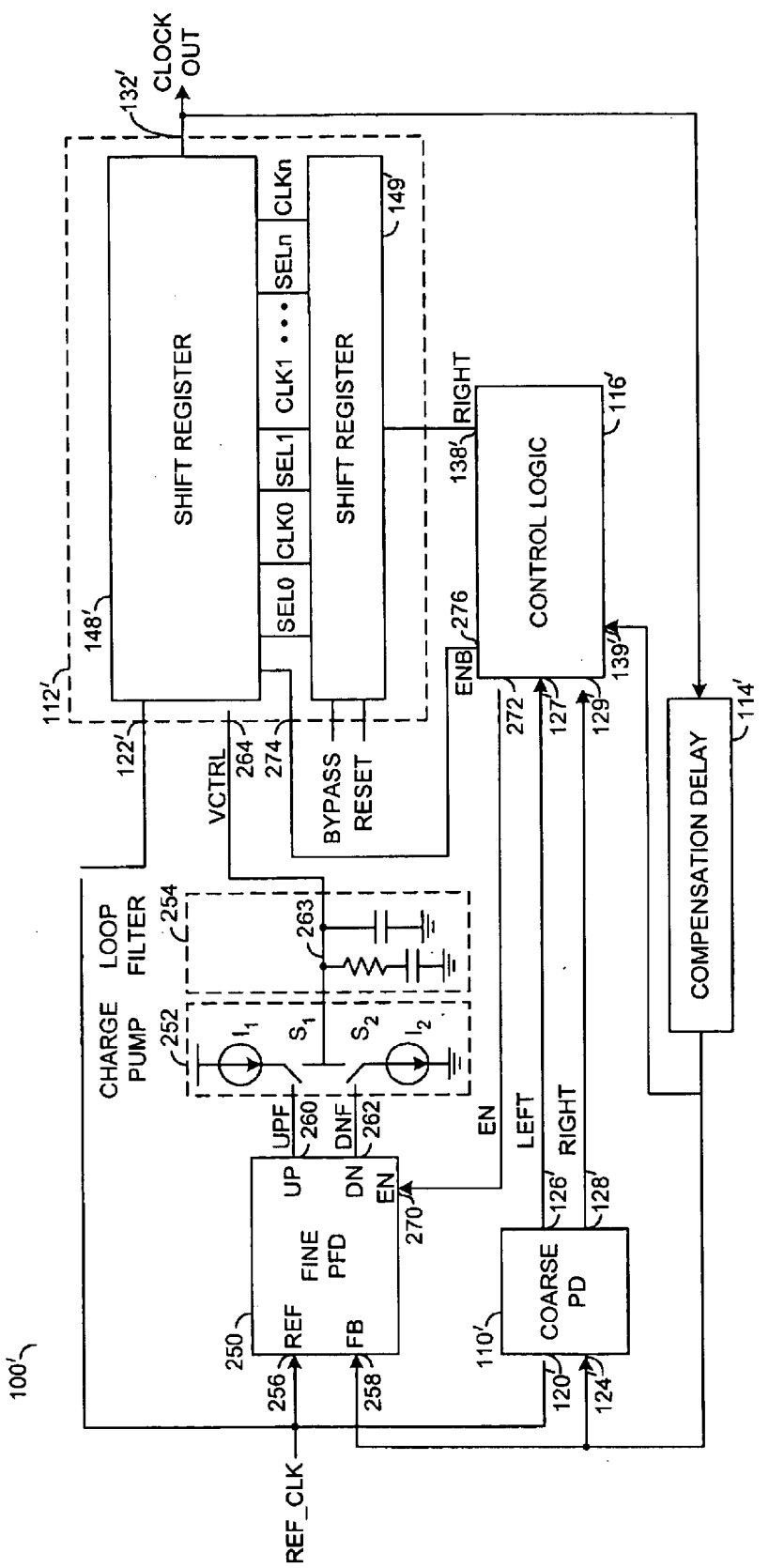
FIG. 14 is a more detailed block diagram of a self-clocking digitally controlled analog delay line of FIG. 13.

Referring to FIG. 14, a more detailed block diagram of the circuit 100' is shown. The circuit 250 may have an enable input 270 that may receive a signal (e.g., EN) from an output 272 of the control circuit 116'. The circuit 112' may have an input 274 that may receive a signal (e.g., ENB) from an output 276 of the control circuit 116'. The signal ENB may be a digital complement of the signal EN. The circuit 112' may be configured to enable/disable the self-clocking operation in response to the signal ENB. The circuit 112' may receive the control signals BYPASS and RESET. The circuit 112' may be configured to enter a preconditioned or initialized state in response to the signal RESET. For example, the circuit 112' may be configured to (i) set a number of registers (e.g., 3) to a logical HIGH state, or "one" and (ii) reset any remaining registers to a logical LOW, or "zero", in response to the signal RESET. When the circuit 112' is initialized (reset), a predetermined minimum amount of delay may be selected.

The circuit 112' may comprise a circuit 148' and a circuit 149'. The circuit 148' may be implemented as a delay chain. The circuit 149' may be implemented as a shift register. The circuit 148' may receive the signal REF_CLK, the signal VCTRL, the signal ENB, and one or more control signals (e.g., SEL0–SELn) from the circuit 149'. The circuit 148' may present one or more clock signals (e.g., CLK0–CLKn) to the circuit 149'. The circuit 149' may receive the signal BYPASS, the signal RESET, and the signal RIGHT. The circuit 148' may be configured to generate the signal CLK_OUT in response to the signal REF_CLK, the signal VCTRL, and the signals SEL0–SELn. The circuit 148' may be further configured to generate the signals CLK0–CLKn in response to the signals REF_CLK, ENB, and SEL0–SELn. The circuit 149' may be configured to generate the signals SEL0–SELn in response to the signals BYPASS, RESET, RIGHT and CLK0–CLKn.

Following start-up or when the fine adjustment range is exceeded, the circuit 100' may be configured to perform a coarse delay adjustment. During the coarse delay adjustment, the control voltage VCTRL may be set at a maximum value, the signal ENB may be asserted, the signal RIGHT may be asserted, and the circuit 112' will generally add a predetermined amount of delay every cycle until the coarse phase detector 110' de-asserts the signal RIGHT and asserts the signal LEFT. The signal RIGHT is generally de-asserted when the delay produced by the delay line 112' overshoots the desired amount. When the signal RIGHT is de-asserted, the control circuit 116' will generally control the circuit 112' to remove an amount of delay determined by the signal LEFT. When the circuit 112' has removed the desired amount of delay, the signal EN may be asserted and the signal ENB may be de-asserted. When the signal ENB is de-asserted, the self-clocking of the circuit 112' is generally disabled. When the signal EN is asserted, the fine phase detector 250 is generally enabled to further adjust the delay provided by the circuit 112'.

After the coarse delay adjustment a fine delay adjustment may be performed. The number of delay elements may remain unchanged and the delay through each element may be varied in response to the signal VCTRL. The delay through each element may be set to a predetermined maximum value during the coarse adjustment. The delay range of each element as a function of the control voltage VCTRL may be predetermined to ensure that the fine adjustments can slow the delay line down into lock.

The coarse and fine adjustment may be implemented by using a chain of delay elements configured to generate a total delay that is greater than a predetermined maximum period of operation when the control voltage VCTRL is at a high range value. The shift register 149' may be used to increment through the delay elements during the coarse adjustment. Each cycle a shift right may occur and the output of the delay chain may be taken from the next delay element. All delay elements that have a logical LOW or "zero" on an enable input may be powered down so that only the minimum number of delay elements necessary are used. Minimizing the number of delay elements may reduce power consumption.

Figure 15:
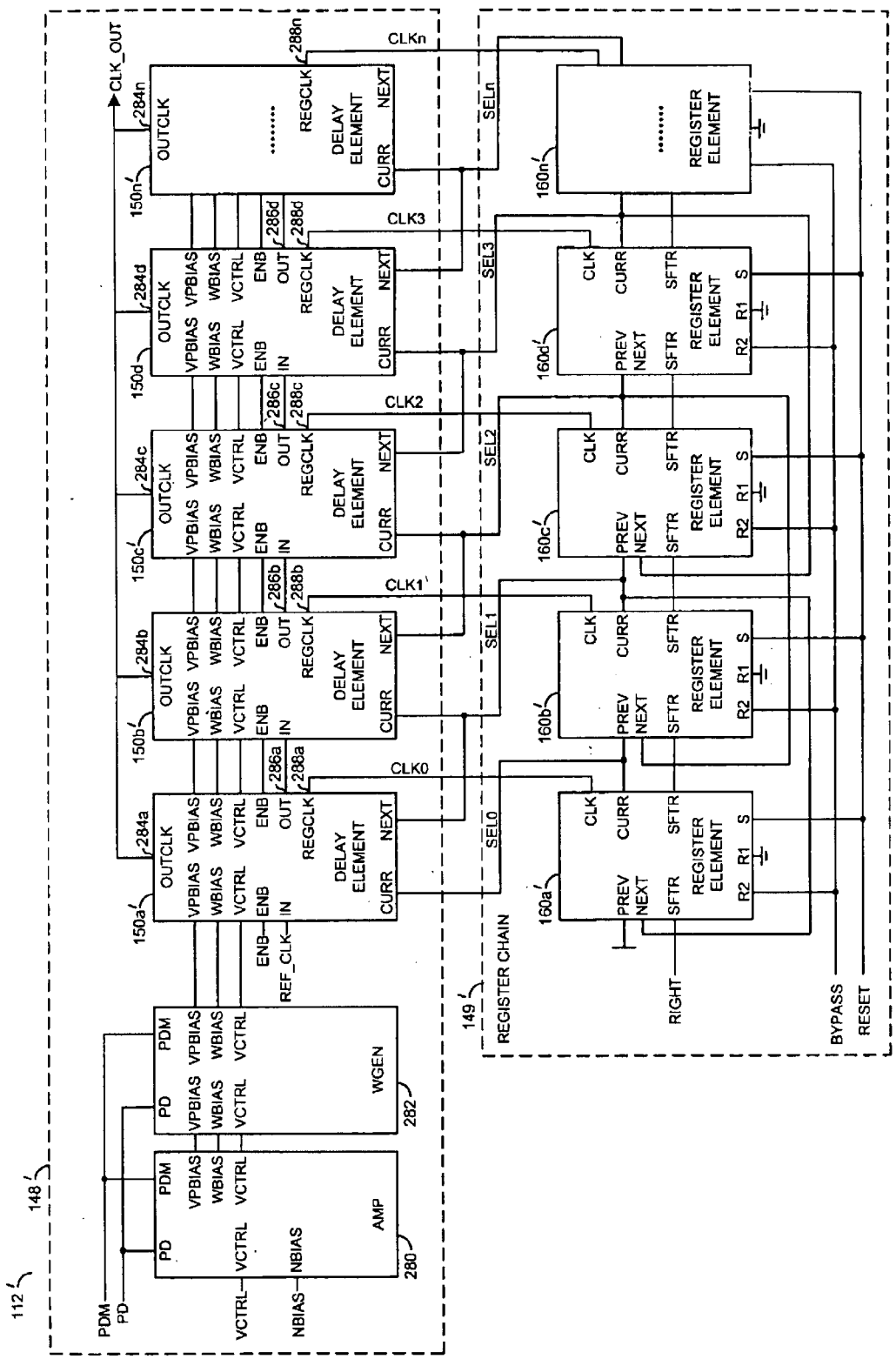
FIG. 15 is a more detailed block diagram of a self-clocking digitally controlled analog delay line of FIG. 14.

Referring to FIG. 15, a more detailed block diagram of the circuit 112' of FIG. 14 is shown. The circuit 148' may comprise an amplifier 280, a bias generator circuit 282, and a number of delay elements 150a'–150n'. The circuit 149' may comprise a number of register elements 160a'–160n'. The amplifier 280 may receive the signal VCTRL, a signal (e.g., PD), a signal (e.g., PDM), a signal (e.g., NBIAS), and a signal (e.g., WBIAS). The signal NBIAS may be implemented as a bias signal. The signal NBIAS may be generated by the charge pump circuit 252. In one example, the circuit 252 may comprise a current reference circuit that may be configured to generate the signal NBIAS. The signal WBIAS may be a PFET back bias (or nwell) voltage for the PFETs in the delay chain. The circuit 280 may be configured to generate a bias voltage (e.g., VPBIAS) in response to the signals VCTRL, NBIAS, WBIAS, PD and PDM. The signal PD may be implemented as a powerdown signal. The signal PDM may be a complement of the signal PD. The circuits 280 and 282 may be configured to enter a powerdown or low current mode in response to the signal PD and/or the signal PDM.

The circuit 282 may receive the signals VPBIAS, VCTRL, PD and PDM. The circuit 282 may be implemented as a well-bias generator circuit. circuit 282 may be configured to generate the bias voltage WBIAS in response to the signals VCTRL and PBIAS. The voltage WBIAS may be presented at a substrate connection of each of the PFETs in the delay elements 150a'–150n'.

The circuits 150a'–150n' may have a first input that may receive the signal VPBIAS, a second input that may receive the signal WBIAS, a third input that may receive the signal VCTRL, a fourth input that may receive the signal ENB and a fifth input that may receive the signal REF_CLK or an output signal from another one of the circuits 150a'–150n'. Each of the circuits 150a'–150n' may have an output 284a–284n that may be connected together to form a node 159', an output 286a–286n that may present an output signal to the fifth input of another one of the circuits 150a'–150n', and an output 288a–288n that may present the signals CLK0–CLKn. The signal CLK_OUT may be presented at the node 159'. The circuit 150a' may have a first control input (e.g., CURR) that may receive the signal SEL0 and a second control input (e.g., NEXT) that may be connected to the first control input (CURR) of the circuit 150b'. A second control input (e.g., NEXT) of the circuit 150b' may be connected to the first control input (CURR) of the circuit 150c'. The first control input (e.g., CURR) of the circuit 150b' may receive the signal SEL1 from a corresponding register element (e.g., 160b'). The remaining delay elements 150c'–150n' may be connected similarly.

The signal RIGHT may be presented to a first input of the circuits 160a'–160n'. The signal BYPASS may be presented to a second input of the circuits 160a'–160n'. The signal RESET may be presented to a third input of the circuits 160a'–160n'. The circuits 160a'–160n' may be connected in a serial fashion. For example, an output (e.g., SEL0) of a previous circuit (e.g., 160a') may be presented to an input of a current circuit (e.g., 160b') and an output (e.g., SEL2) of a next circuit (e.g., 160c') may be presented to an input (e.g., NEXT) of the current circuit (e.g., 160b'). The signals CLK0–CLKn may be presented to a respective input of the circuits 160a'–160n'. The signals SEL0–SELn may be presented at a respective output of the circuits 160a'–160n'.

Figure 16:
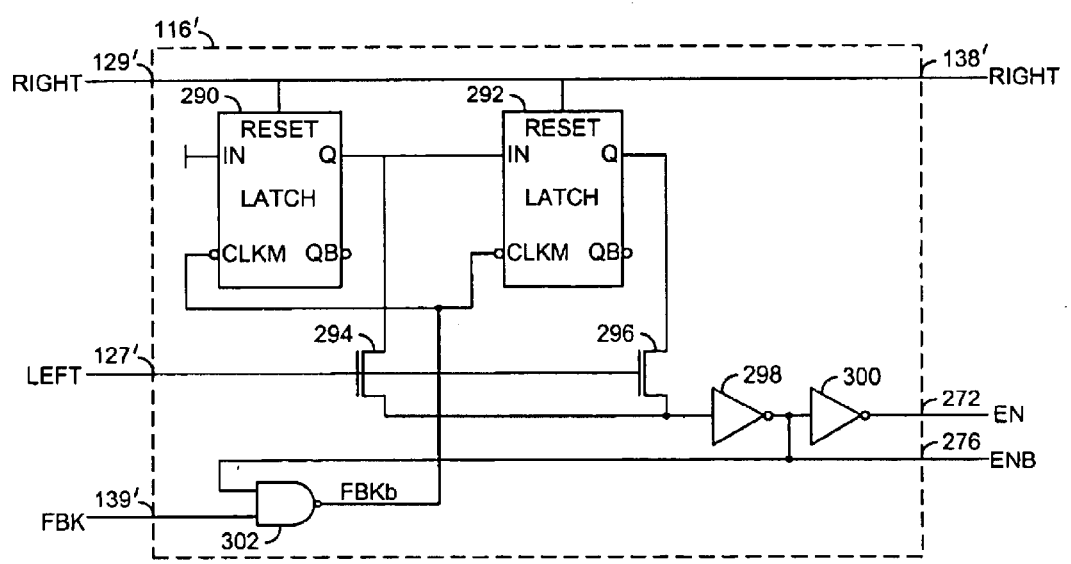
FIG. 16 is a more detailed block diagram of a digital control circuit of FIG. 14.

Referring to FIG. 16, a more detailed block diagram of a digital control circuit 116' of FIG. 14 is shown. The circuit 116' may comprise a storage element 290, a storage element 292, a transistor 294, a transistor 296, a gate 298, a gate 300 and a gate 302. The storage elements 290 and 222 may be implemented, for example, using a register, a latch or a flip-flop. The transistor 294 may be implemented, in one example, as one or more PMOS transistors. The transistor 296 may be implemented, in one example, as one or more NMOS transistors. However, other types and polarity transistors may be implemented accordingly to meet the design criteria of a particular application. The gates 298 and 300 may be implemented, in one example, as inverters. The gate 302 may be implemented, in one example, as a two-input NAND gate. However, other types of gates may be implemented accordingly in order to meet the design criteria of a particular application.

The signal RIGHT may be presented to a reset input of the storage elements 290 and 292. An input of the storage element 290 may be connected to the supply voltage VCC. An output of the storage element 290 may be connected to an input of the storage element 292 and a first source/drain of the transistor 294. A Q-output of the storage element 292 may be connected to a first source/drain transistor 296. A clock input of the storage elements 290 and 292 may receive a signal (e.g., FBKb). The signal LEFT may be presented to a gate of the transistor 294 and a gate of the transistor 296. A second source/drain of the transistor 294 may be connected to a second source/drain of the transistor 296 and an input of the gate 298. An output of the gate 298 may present the signal ENB to an input of the gate 300 and a first input of the gate 302. An output of the gate 300 may present the signal EN. The signal FBK may be presented to a second input of the gate 302. An output of the gate 302 may present the signal FBKb.

Figure 17:
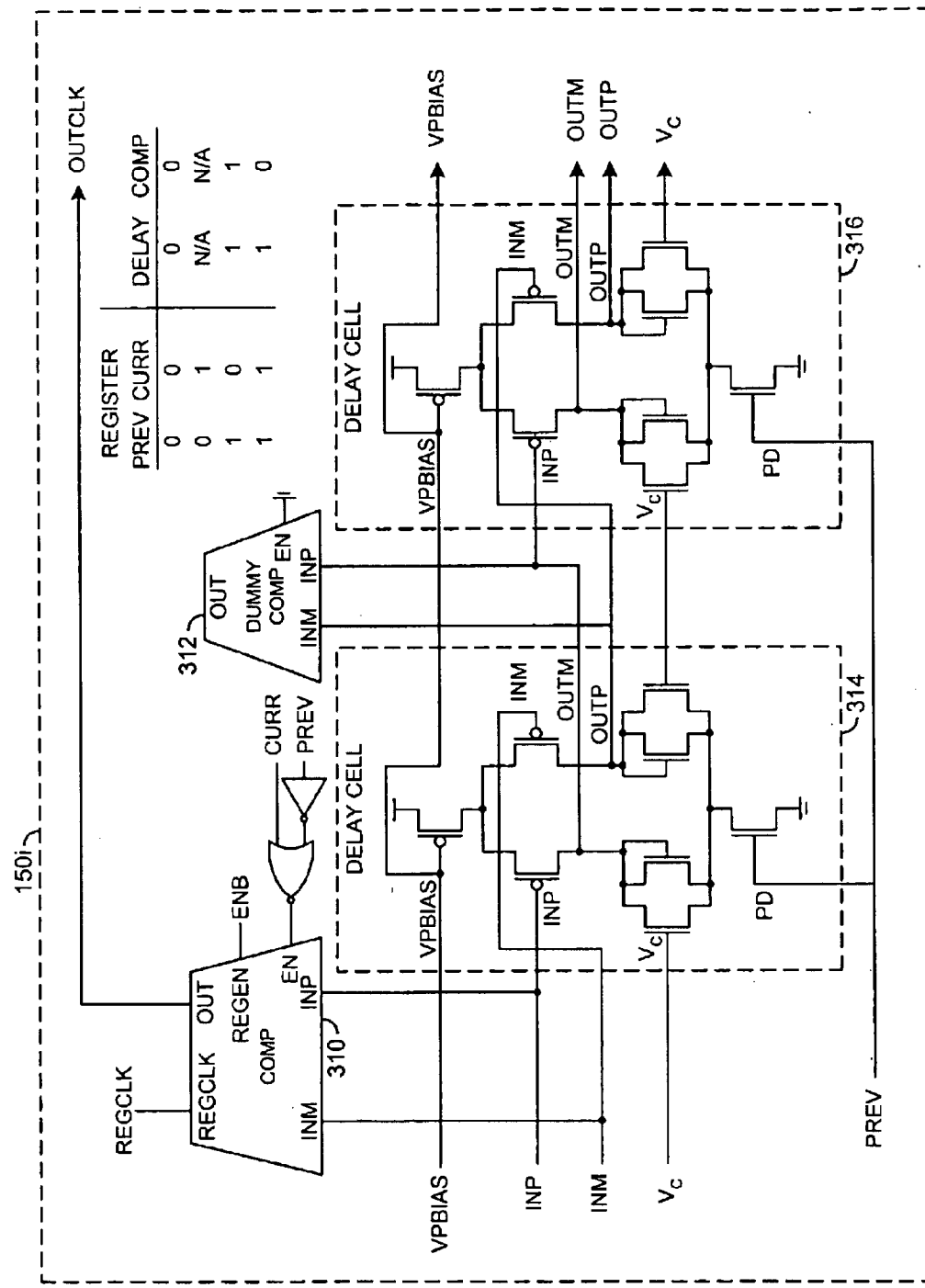
FIG. 17 is a more detailed block diagram of a delay element of FIG. 15.

Referring to FIG. 17, a detailed block diagram of a delay element 150i of FIG. 15 is shown. The delay element 150i may comprise an amplifier 310, an amplifier 312, a delay cell 314, and a delay cell 316. The delay element 150i may include the two delay cells 314 and 316 so that performance requirements for each of the individual delay cells 314 and 316 may be less stringent (relaxed). However, the delay element 150i may be implemented, in an alternative embodiment, with one amplifier and one delay cell. The amplifiers 310 and 312 may comprise a limited swing differential to full swing amplifier and control logic. In one example, each of the amplifiers 310 and 312 may be implemented as a differential CMOS amplifier. The amplifier 310 may have a first output that may present a first output signal (e.g., OUTCLK) of the delay element 150i and a second output that may present a second output signal (e.g., REGCLK). The delay cells 314 and 316 may be implemented similarly to the delay cells described in the co-pending application U.S. Ser. No. 09/918,583 which is hereby incorporated by reference in its entirety.

The amplifier 312 may be configured to act as a "dummy" amplifier. As used herein, the term "dummy" generally refers to the use of an element to set and/or determine conditions of operation of a circuit rather than provide an actual output for the circuit. An output of the amplifier 312 may be disabled by connecting an enable input to the supply ground VSS. The amplifier 312 may be used to match the load and coupling of the amplifier 310. An enable input of the amplifier 310 may be connected to a control logic circuit. In one example, the control logic circuit may be configured to enable the signal OUTCLK when an enable signal from an associated register element 160i is a logical LOW or "zero" and a previous delay element has an enable signal that is a logical HIGH or "one". However, other enable states and logic may be implemented to meet the design criteria of a particular application. The amplifier 310 may be further configured to gate the signal REGCLK in response to the signal ENB.

Figure 18:
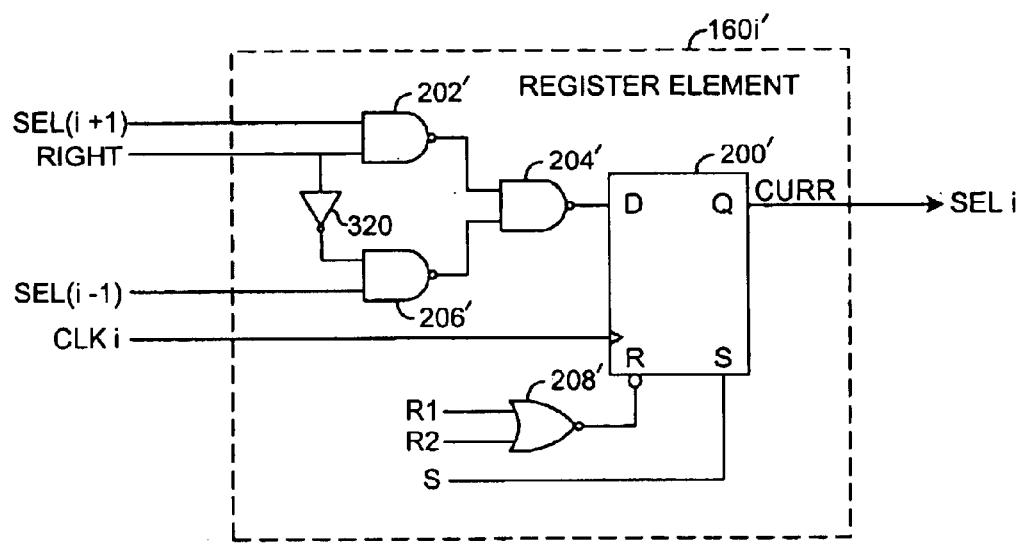
FIG. 18 is a more detailed block diagram of a register element of FIG. 15.

Referring to FIG. 18, a more detailed block diagram of a register element 160i' of FIG. 15 is shown. The register element 160i' may be implemented similarly to the register element 160i (described in more detail in connection with FIG. 10). However, the register element 160i' may be configured to receive the signal RIGHT instead of the signal RIGHT_OUT and a complement of the signal RIGHT instead of the signal LEFT_OUT. The register element 160i' may comprise a gate 320 that may be implemented, in one example, as an inverter.

Figure 19:
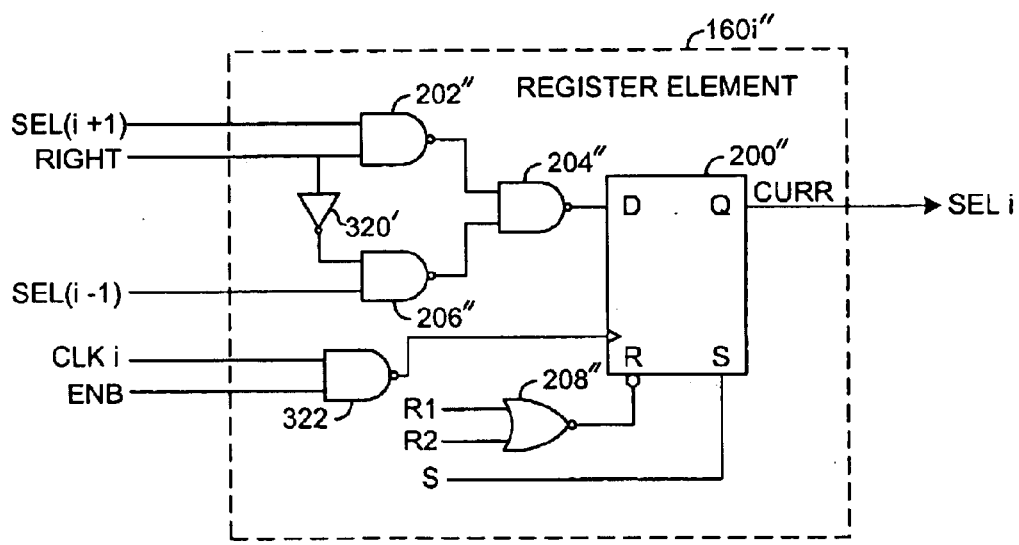
FIG. 19 is a more detailed block diagram of an alternative embodiment of the register element of FIG. 18.

Referring to FIG. 19, a block diagram of a register element 160i" is shown illustrating an alternative embodiment of the register element of FIG. 18. In an alternative embodiment, the signal ENB may be presented to the circuit 149' instead of the circuit 148'. The circuits 160a"–160n" may be configured to gate the signals CLK0–CLKn in response to the signal ENB. For example, the circuit 160i" may be implemented similarly to the circuit 160i' except that the circuit 160i" may comprise a gate 322. The gate 322 may be implemented, in one example, as a two-input NAND gate. However, other types of gates may be implemented accordingly to meet the design criteria of a particular application. The signals ENB and CLKi may be presented to inputs of the gate 322. An output of the gate 322 may be connected to a clock input of the register 200".

The various signals of the present invention are generally "ON" (e.g., a digital HIGH, or 1) or "OFF" (e.g., a digital LOW, or 0). However, the particular polarities of the ON (e.g., asserted) and OFF (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed:

1. An apparatus comprising:
   a delay chain configured to generate an output signal and a plurality of clock signals in response to an input signal and delay a plurality of select signals;
   a shift register configured to generate said plurality of select signals in response to said one or more first control signals and a said response to one or more first control signals and a said plurality of clock signals, wherein a phase of said output signal is adjusted in response to said one or more first control signals; and
   a control circuit configured to generate said one or more first control signals in response to said input signal and said output signal.

2. The apparatus according to claim 1, wherein said chain comprises a plurality of delay elements, each delay element configured to generate one of said plurality of clock signals.

3. The apparatus according to claim 2, wherein said each of said delay elements comprises a delay cell and a CMOS pass-gate.

4. The apparatus according to claim 3, wherein said delay cell comprises a CMOS inverter.

5. The apparatus according to claim 1, wherein said shift register comprises a plurality of register elements, each of said register elements configured to generate one of said plurality of select signals in response to said one or more first control signals and one of said plurality of clock signals.

6. The apparatus according to claim 5, wherein each of said register elements is configured to receive said one of said plurality of clock signals from a corresponding delay element.

7. The apparatus according to claim 5, wherein one or more of said register elements are configured to receive one said plurality of select signals from a previous register element and another of said plurality of select signals from a next register element.

8. The apparatus according to claim 5, wherein each of said register elements comprises one or more latches.

9. The apparatus according to claim 1, wherein said control circuit comprises:
   a delay adjustment circuit configured to generate said one or more first control signals in response to said input signal and a feedback signal; and
   a delay circuit configured to generate said feedback signal in response to said output signal and a predetermined delay.

10. The apparatus according to claim 9, wherein said delay adjustment circuit comprises:
    a digital loop filter circuit configured to generate said one or more first control signals in response to a said feedback signal, a second control signal and a third control signal; and
    a phase detector circuit configured to generate said second and third control signals in response to said input signal and said feedback signal.

11. The apparatus according to claim 10, wherein said digital loop filter circuit comprises a digital logic circuit configured to control said delay line in response to a phase difference between said input signal and said feedback signal.

12. The apparatus according to claim 10, wherein said phase detector circuit is configured to generate said second and third control signals in response to a phase difference between said input signal and said feedback signal.

13. The apparatus according to claim 9, wherein said delay adjustment circuit comprises:
    an analog loop filter circuit configured to generate one of said one or more first control signals in response to a second control signal and a third control signal;
    a first phase detector circuit configured to generate said second and third control signals in response to said input signal and said feedback signal; and
    a second phase detector circuit configured to generate another of said one or more first control signals in response to said input signal and said feedback signal.

14. An apparatus comprising:
    means for generating an output signal and a plurality of clock signals in response to an input signal and control a plurality of select signals, wherein a phase of said output signal is adjusted in response to one or more control signals;
    means for generating a said plurality of select signals and a said plurality of clock signals; and
    means for generating said one or more control signals in response to said input signal and said output signal.

15. A method for locking and adjusting a phase of an output signal with respect to a phase of an input signal comprising the steps of:
    (A) generating an output signal and a plurality of phase of an input signal in response to an said input signal and a plurality of select signals, wherein a phase of said output signal is adjusted in response to said one or more control signals;
    (B) generating said plurality of select signals in response to said one or more control signals and said plurality of phase of said input signal; and
    (C) generating said one or more control signals in response to said input signal and said output signal.

16. The method according to claim 15, wherein said one or more control signals comprises a digital control signal.

17. The method according to claim 15, wherein step (B) comprises:
    updating a plurality of pointers in response to said one or more control signals and said plurality of phases of said input signal.

18. The method according to claim 15, wherein said output signal is generated in response to a self-clocking delay line.

19. The method according to claim 15, wherein step (A) comprises:
    controlling a state of a delay element in response to (i) said one or more control signals, (ii) a state of a previous delay element, (iii) a state of a next delay element and (iv) a clock signal generated by said delay element.

20. An apparatus comprising:
    a delay line configured to generate an output signal in response to an input signal and one or more first control signals, wherein (i) said delay line generates a plurality of select signals in response to said one or more first control signals and a plurality of clock signals and (ii) a phase of said output signal is adjusted in response to said one or more first control signals;
    an analog loop filter circuit configured to generate one of said one or more first control signals in response to a second control signal and a third control signal;
    a first phase detector circuit configured to generate said second control signal and said third control signal in response to said input signal and a feedback signal;
    a second phase detector circuit configured to generate another of said one or more first control signals in response to said input signal and said feedback signal; and
    a delay circuit configured to generate said feedback signal in response to said output signal and a predetermined delay.

* * * * *